(12) United States Patent
Hamada

(10) Patent No.: US 11,640,920 B2
(45) Date of Patent: May 2, 2023

(54) SAMPLE HOLDER

(71) Applicant: KYOCERA Corporation, Kyoto (JP)

(72) Inventor: Miki Hamada, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 196 days.

(21) Appl. No.: 16/965,419

(22) PCT Filed: Jan. 29, 2019

(86) PCT No.: PCT/JP2019/002931
§ 371 (c)(1),
(2) Date: Jul. 28, 2020

(87) PCT Pub. No.: WO2019/146796
PCT Pub. Date: Aug. 1, 2019

(65) Prior Publication Data
US 2021/0143046 A1 May 13, 2021

(30) Foreign Application Priority Data

Jan. 29, 2018 (JP) .............................. JP2018-012757

(51) Int. Cl.
*H01L 21/687* (2006.01)
*H01L 21/67* (2006.01)

(52) U.S. Cl.
CPC ...... *H01L 21/6875* (2013.01); *H01L 21/6715* (2013.01); *H01L 21/68757* (2013.01); *H01L 21/68785* (2013.01)

(58) Field of Classification Search
CPC ............. H01L 21/6875; H01L 21/6715; H01L 21/68757; H01L 21/68785

USPC ........................................................ 118/728
See application file for complete search history.

(56) References Cited

U.S. PATENT DOCUMENTS

| | | | | |
|---|---|---|---|---|
| 5,886,863 | A * | 3/1999 | Nagasaki | H02N 13/00 279/128 |
| 6,072,685 | A * | 6/2000 | Herchen | H01L 21/6833 279/128 |
| 6,151,203 | A * | 11/2000 | Shamouilian | H01L 21/6833 361/234 |
| 9,042,078 | B2 * | 5/2015 | Wada | H01L 21/6875 361/230 |
| 10,037,909 | B2 * | 7/2018 | Aramaki | H01J 37/32715 |
| 2006/0037857 | A1 * | 2/2006 | Natsuhara | H01L 21/6831 204/297.06 |

(Continued)

FOREIGN PATENT DOCUMENTS

| | | |
|---|---|---|
| JP | 02-132954 U | 11/1990 |
| JP | 2013-191626 A | 9/2013 |

*Primary Examiner* — Charlee J. C. Bennett
(74) *Attorney, Agent, or Firm* — Volpe Koenig

(57) ABSTRACT

A sample holder according to the disclosure includes: an insulating base body in plate form; an electrically conducting member disposed on a lower face of the insulating base body; a lead pin joined to the electrically conducting member so as to extend downwardly from the insulating base body; a tubular member joined to the lower face of the insulating base body so as to surround the lead pin; a first member which is located in an interior of the tubular member and covers a junction between the electrically conducting member and the lead pin, the first member being in a gel form; and a second member which covers the first member and is filled in the interior.

8 Claims, 4 Drawing Sheets

(56) References Cited

U.S. PATENT DOCUMENTS

| | | | | |
|---|---|---|---|---|
| 2013/0286531 | A1* | 10/2013 | Shiraiwa | H01L 21/6833 361/234 |
| 2019/0385883 | A1* | 12/2019 | Yoshikawa | H01L 21/6833 |
| 2020/0173017 | A1* | 6/2020 | Ramalingam | H01J 37/32724 |
| 2020/0411357 | A1* | 12/2020 | Kunita | H01L 21/683 |

* cited by examiner

SAMPLE HOLDER

CROSS-REFERENCE TO RELATED APPLICATIONS

This application is a national stage entry according to 35 U.S.C. 371 of International Application No. PCT/JP2019/002931 filed on Jan. 29, 2019, which claims priority to Japanese Patent Application No. 2018-012757 filed on Jan. 29, 2018, the contents of which are entirely incorporated herein by reference.

TECHNICAL FIELD

The present disclosure relates to a sample holder.

BACKGROUND

For example, a semiconductor manufacturing apparatus described in Japanese Unexamined Patent Publication JP-A 2013-191626 (hereafter referred to as Patent Literature 1) is known as a sample holder. The semiconductor manufacturing apparatus disclosed in Patent Literature 1 includes: a ceramic substrate; an electrode terminal disposed on a back side of the ceramic substrate; a base member secured to the back side of the ceramic substrate; an insulating sleeve fixedly received in a through hole of the base member; a cable connected to the electrode terminal; and an insulating resin which covers a gap between the insulating sleeve and the ceramic substrate along with a junction between the electrode terminal and the cable.

SUMMARY

A sample holder according to the disclosure includes: an insulating base body in plate form; an electrically conducting member disposed on a lower face of the insulating base body; a lead pin joined to the electrically conducting member so as to extend downwardly from the insulating base body; a tubular member joined to the lower face of the insulating base body so as to surround the lead pin; a first member which is located in an interior of the tubular member and covers a junction between the electrically conducting member and the lead pin, the first member being in a gel form; and a second member which covers the first member and is filled in the interior.

DETAILED DESCRIPTION

The following details an embodiment of a sample holder 10 according to the disclosure with reference to drawings.

Figure 1:
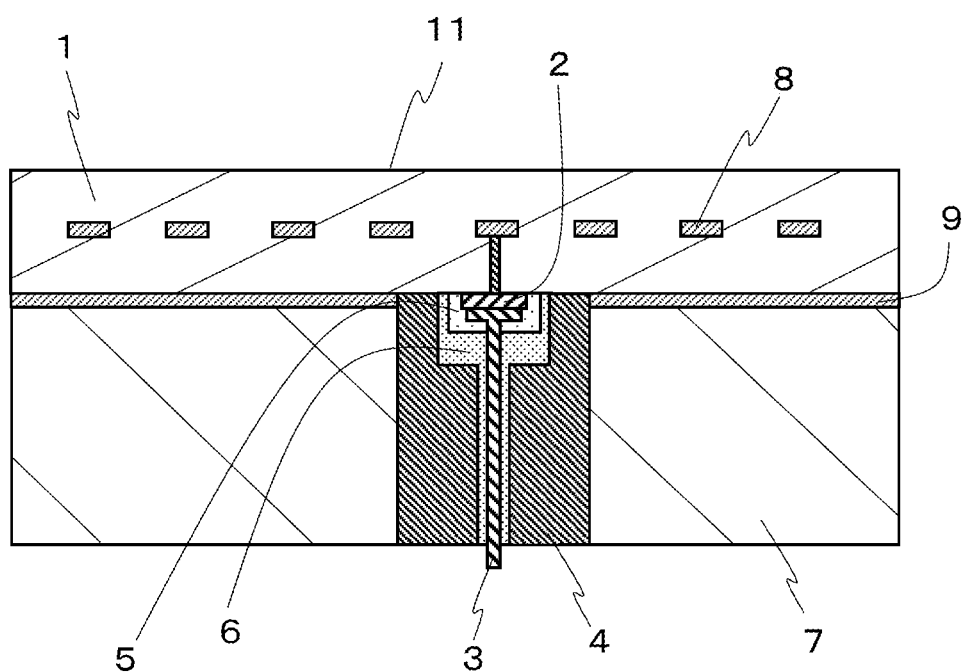
FIG. 1 is a sectional view showing an embodiment of a sample holder.

FIG. 1 is a sectional view showing a sample holder 10 according to an embodiment of the disclosure. As shown in FIG. 1, the sample holder 10 includes an insulating base body 1, an electrically conducting member 2, a lead pin 3, and a tubular member 4.

The insulating base body 1 holds a sample. The insulating base body 1 is a plate-like member, for example, a member shaped in a circular plate or rectangular plate. The insulating base body 1 includes an upper face and a lower face. For example, the upper face of the insulating base body 1 serves as a sample holding face 11. A heat-generating resistor 8 may be disposed inside the insulating base body 1, or may be disposed on the lower face of the insulating base body 1. For cases where the sample holder 10 is used as an electrostatic chuck, the insulating base body 1 may include an electrostatic adsorption electrode thereinside. For example, the insulating base body 1 includes a ceramic material. Examples of the ceramic material include alumina, aluminum nitride, silicon nitride, and yttria. For example, the insulating base body 1 can measures 48 to 460 mm in diameter and 1 to 18 mm in thickness.

As employed herein the terms "upper face" and "lower face" are used for convenience in explanation, and are not intended to limit the embodiment of the invention. For example, the sample holder 10 may be used so that the upper face is located below the lower face.

The electrically conducting member 2 is disposed on the lower face of the insulating base body 1. In the case where the heat-generating resistor 8 is disposed inside the insulating base body 1, the electrically conducting member 2 may be built as a member electrically connected to the heat-generating resistor 8. In this case, the insulating base body 1 may include a through hole conductor which electrically connects the heat-generating resistor 8 and the electrically conducting member 2. For example, the electrically conducting member 2 includes an electrically conductive material such as platinum, AgPb, or tungsten. For example, the electrically conducting member 2 can measure 400 to 160000 $mm^2$ in a surface area exposed at the lower face, and can measure 0.005 to 0.1 mm in thickness.

In the case where the heat-generating resistor 8 is disposed on the lower face of the insulating base body 1, the electrically conducting member 2 itself may serve as the heat-generating resistor 8.

The lead pin 3 is a member for electrically connecting the electrically conducting member 2 and an external power supply. For example, the lead pin 3 has a rod-like shape. For example, the lead pin 3 is joined at one end thereof to the electrically conducting member 2 via a joining material. For example, the lead pin 3 includes an electrically conductive material such as a Fe—Ni—Co alloy or Ti. For example, the lead pin 3 can measure 1 to 10 mm in width when viewed from a section perpendicular to the sample holding face 11, and can measure 3 to 20 mm in length. For example, solder or a silver-copper brazing material may be used as the joining material.

The tubular member 4 is a member for ensuring electrical isolation between the lead pin 3 and a metallic base body 7. The tubular member 4 is joined to the lower face of the insulating base body 1 so as to surround the lead pin 3. For example, the tubular member 4 is joined to the lower face of the insulating base body 1 via an adhesive 9. For example, the tubular member 4 is a cylindrically shaped member. For example, the tubular member 4 may be configured to have a portion of large inside diameter and a portion of small inside diameter. For example, the tubular member 4 includes polyetherimide, fluorine resin, or ceramics such as alumina. For example, the tubular member 4 can measure 1.5 to 8 mm in inside diameter, can measure 4 to 30 mm in outside diameter, and can measure 10 to 50 mm in length.

The lower face of the insulating base body 1 may be provided with the metallic base body 7. The metallic base body 7 a member for supporting the insulating base body 1. For example, the metallic base body 7 is a member shaped in a circular plate. The metallic base body 7 may be provided with a plurality of through holes, each receiving therein the tubular member 4. For example, the metallic base body 7 includes a metal material such as Cu or a Fe—Ni—Co alloy. For example, the metallic base body 7 can measure 48 to 460 mm in diameter, and can measure 10 to 50 mm in thickness.

A heater according to the disclosure includes a first member 5 which is located in an interior of the tubular member 4, and covers the junction between the electrically conducting member 2 and the lead pin 3, and a second member 6 filled in the interior, and the first member 5 is in a gel form. This arrangement makes it possible to diminish the likelihood of deterioration in the quality of the electrically conducting member 2 caused by the entry of moisture into the tubular member 4. Moreover, when the junction between the electrically conducting member 2 and the lead pin 3 is subjected to an external force while the lead pin 3 is secured to the tubular member 4 via the second member 6, it is possible to absorb the external force by deformation of the first member 5 in gel form. This makes it possible to diminish the likelihood of causing damage to the junction between the electrically conducting member 2 and the lead pin 3. As a result, the durability of the sample holder 10 can be increased.

For example, the first member 5 may use silicone, which turns into a gel through a curing process. Moreover, for example, the second member 6 may use a material such as epoxy resin or silicone, which turns into a tack-free solid through a curing process. As employed herein the term "gel" refers to a substance which changes to a viscous solid state throughout the system through a curing process.

Moreover, the first member 5 may be a member having a smaller elastic modulus than the second member 6. Also in this case, the first member 5 can relieve a thermal stress developed in the junction between the electrically conducting member 2 and the lead pin 3. This makes it possible to diminish the likelihood of causing damage to the junction between the electrically conducting member 2 and the lead pin 3. As a result, the durability of the sample holder 10 can be increased. As an example in which the first member 5 is a member having a smaller elastic modulus than the second member 6, for example, in the case where the second member 6 is made of epoxy resin, the first member 5 can be made of silicone resin.

There is no need for the second member 6 to fill the entire interior of the tubular member 4. The second member 6 needs only be sufficiently large in dimensions to prevent the entry of foreign matter such as moisture into the tubular member 4. For example, in the tubular member 4 which includes, as exemplified in FIG. 1, a portion of large inside diameter and a portion of small inside diameter, in the case where the junction between the electrically conducting member 2 and the lead pin 3 is surrounded by the large-inside-diameter portion, the second member 6 is filled in the tubular member 4 so as to lie at least in the large-inside-diameter portion.

Figure 2:
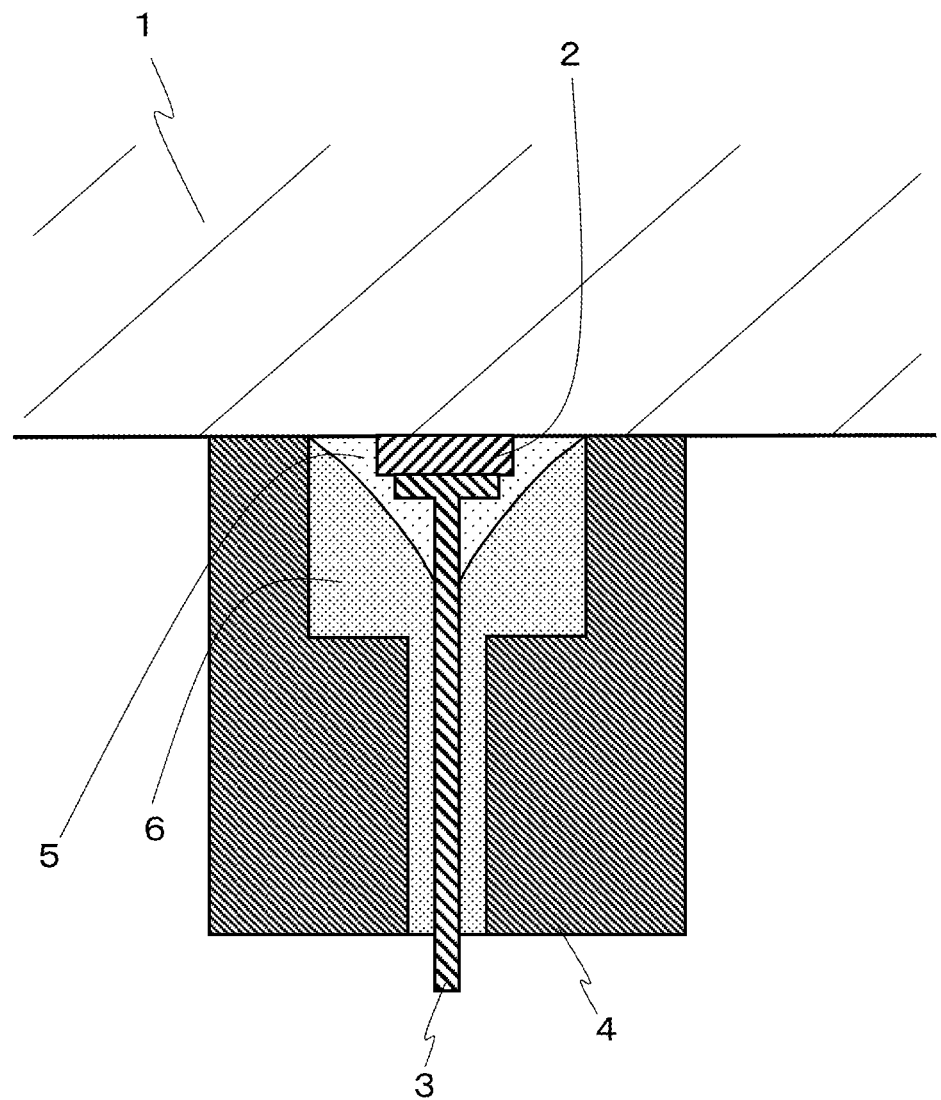
FIG. 2 is a sectional view showing another embodiment of the sample holder.

Moreover, as shown in FIG. 2, the first member 5 may be tapered off in the direction away from the lower face when viewed from a section perpendicular to the lower face. In this case, a volume of the first member 5 is relatively large in the vicinity of the lower face of the insulating base body 1, and thus a thermal stress developed in the junction between the electrically conducting member 2 and the lead pin 3 can be relieved by the first member 5. Moreover, a volume of the second member 6 can be increased with decreasing proximity to the lower face. This makes it possible to enhance the adherability of the lead pin 3. As a result, the durability of the sample holder 10 can be increased.

Figure 3:
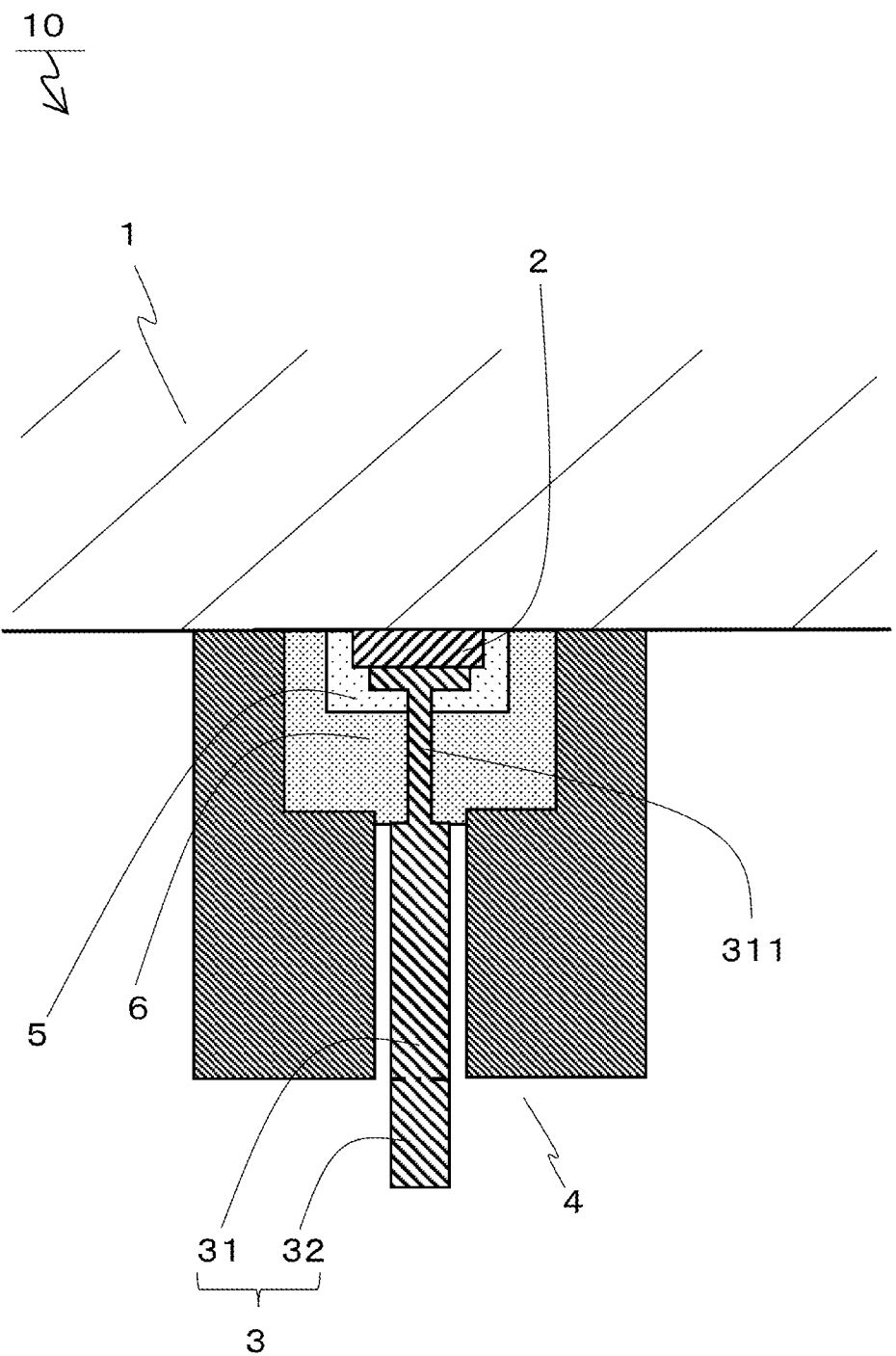
FIG. 3 is a sectional view showing still another embodiment of the sample holder.

Moreover, as shown in FIG. 3, the lead pin 3 may include a first portion 31 located in the interior of the tubular member 4 and a second portion 32 located outside the tubular member 4, the first portion 31 including a third portion 311 which is thinner than the second portion 32. In this case, the third portion 311 can become deformed when the first portion 31 is subjected to a stress. Therefore, the stress developed in the first portion 31 can be absorbed by the third portion 311. As a result, it is possible to diminish the likelihood of causing damage to the junction between the electrically conducting member 2 and the lead pin 3 caused by the stress developed in the first portion 31. Moreover, since the second portion 32 is thicker than the third portion 311, it is possible to increase the resistance of the construction to an external force. As a result, the durability of the sample holder 10 can be increased.

In this case, for example, the third portion 311 can measure 1 to 3 mm in diameter, and the second portion 32 can measure 1.5 to 5 mm in diameter. Moreover, for example, the third portion 311 can measure 3 to 35 mm in length, and the second portion 32 can measure 1 to 50 mm in length. There is no need for the first portion 31 to be made entirely as the third portion 311 which is thinner than the second portion 32. The first portion 3 may include a portion which is greater than or substantially equal to the second portion 32 in thickness. Moreover, the first portion 3 may include a portion which is equal in diameter to the second portion 32 made as a continuous portion extending along the interior of the tubular member 4.

Moreover, the lead pin 3 may be made wider at the junction with the electrically conducting member 2 than at the third portion 311. This makes it possible to increase an area of contact between the electrically conducting member 2 and the lead pin 3, and thus to enhance adhesion between the electrically conducting member 2 and the lead pin 3.

Figure 4:
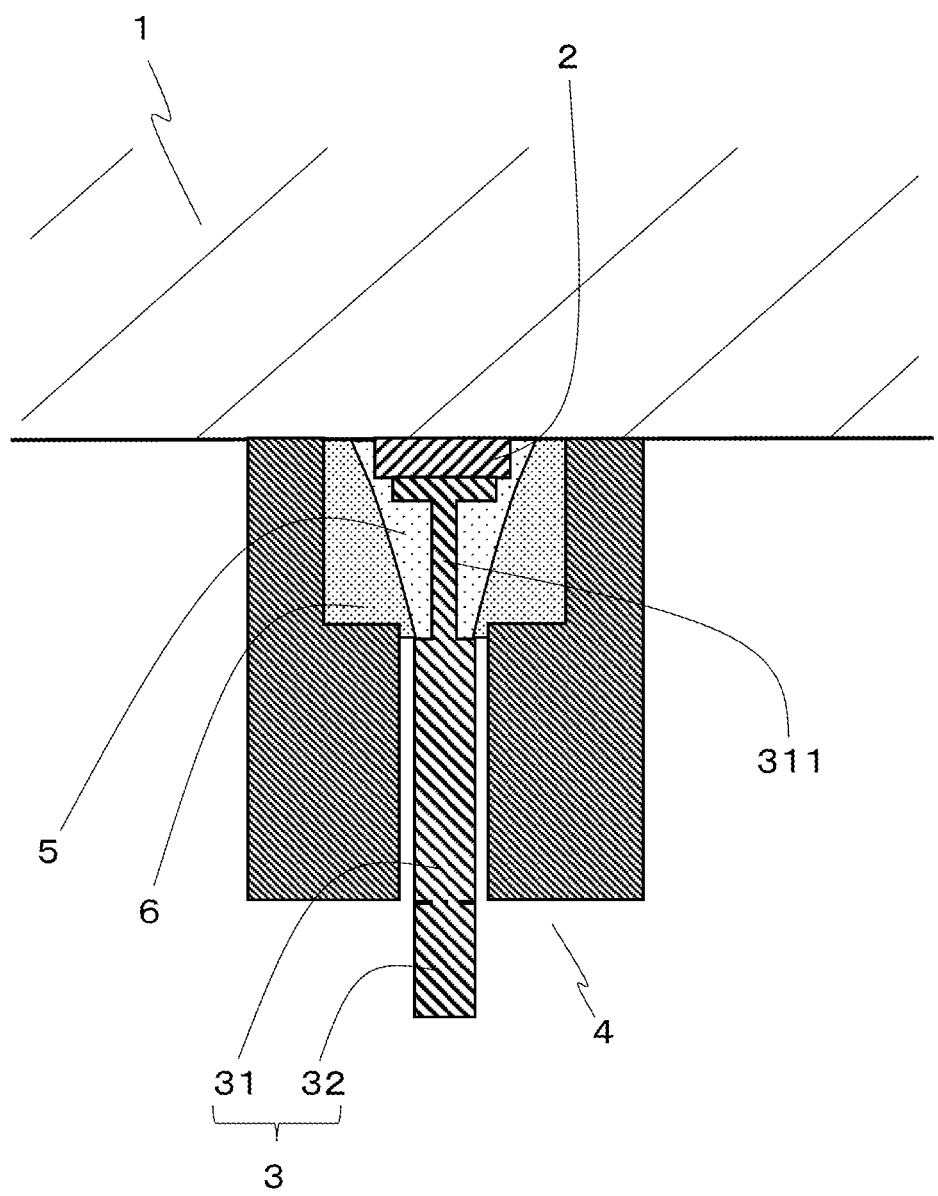
FIG. 4 is a sectional view showing still another embodiment of the sample holder.

Moreover, as shown in FIG. 4, the third portion 311 may be positioned in the vicinity of the junction, and the first member 5 may cover the third portion 311 and the junction between the electrically conducting member 2 and the lead pin 3. This makes it possible to diminish the likelihood of causing damage to the lead pin 3 at the junction and nearby regions that are particularly susceptible to stress concentration. As a result, the durability of the sample holder 10 can be increased.

REFERENCE SIGNS LIST

1: Insulating base body
11: Sample holding face
2: Electrically conducting member
3: Lead pin
31: First portion
311: Third portion
32: Second portion
4: Tubular member
5: First member
6: Second member
7: Metallic base body
8: Heat-generating resistor
9: Adhesive
10: Sample holder

The invention claimed is:

1. A sample holder, comprising:
   an insulating base body (1) in plate form;
   a heating resistor (8) located on a lower face of the insulating base body (1)
   an electrically conducting member (2) disposed on the lower face of the insulating base body (1);
   a lead pin (3) joined to the electrically conducting member (2) so as to extend downwardly from the insulating base body (1), wherein the electrically conducting member (2) electrically couples the lead pin (3) to the heating resistor;
   a tubular member (4) having a top surface that is joined to the lower face of the insulating base body so as to surround the lead pin (3);
   a first member (5) which is located in an interior of the tubular member (4) and covers a junction between the electrically conducting member (2) and the lead pin (3); and
   a second member (6) that is located in the interior of the tubular member, wherein the second member (6) includes:
      a first section that is interposed between the tubular member (4) and the first member (5), wherein the first section tapers from the top surface of the tubular member (4) to the lead pin (3) so that a width of the first member (5) is at a maximum adjacent to the top surface of the tubular member (4), and
      a second section that is interposed between the tubular member (4) and the lead pin (3), wherein the second section coaxially surrounds the lead pin (3) and extends from the first section to a bottom surface of the tubular member (4).

2. A sample holder, comprising:
   an insulating base body (1) in plate form;
   an electrically conducting member (2) disposed on a lower face of the insulating base body (1), wherein the electrically conducting member (2) forms a heating resistor (8);
   a lead pin (3) joined to the electrically conducting member (2) so as to extend downwardly from the insulating base body;
   a tubular member (4) having a top surface that is joined to the lower face of the insulating base body so as to surround the lead pin (3);
   a first member (5) which is located in an interior of the tubular member (4) and covers a junction between the electrically conducting member (2) and the lead pin (3); and
   a second member (6) that is located in the interior of the tubular member, wherein the second member (6) includes:
      a first section that is interposed between the tubular member (4) and the first member (5), wherein the first section tapers from the top surface of the tubular member (4) to the lead pin (3) so that a width of the first member (5) is at a maximum adjacent to the top surface of the tubular member (4), and
      a second section that is interposed between the tubular member (4) and the lead pin (3), wherein the second section coaxially surrounds the lead pin (3) and extends from the first section to a bottom surface of the tubular member (4).

3. The sample holder according to claim 1, wherein the lead pin comprises a first portion located in the interior of the tubular member, and a second portion located outside the tubular member, and the first portion comprises a third portion which is thinner than the second portion.

4. The sample holder according to claim 3,
   wherein the lead pin is wider at the junction with the electrically conducting member than at the third portion.

5. The sample holder according to claim 2,
   wherein the lead pin comprises a first portion located in the interior of the tubular member, and a second portion located outside the tubular member, and
   the first portion comprises a third portion which is thinner than the second portion.

6. The sample holder according to claim 5,
   wherein the lead pin is wider at the junction with the electrically conducting member than at the third portion.

7. The sample holder according to claim 1, wherein-the first member (5) is in a gel form.

8. The sample holder according to claim 2, the first member (5) has a smaller elastic modulus than the second member (6).

* * * * *